United States Patent
Tomiyama

(10) Patent No.: US 6,281,757 B1
(45) Date of Patent: Aug. 28, 2001

(54) HIGH FREQUENCY SIGNAL AMPLIFYING CIRCUIT AND A RECEIVER USING THE SAME

(75) Inventor: Hitoshi Tomiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/564,044

(22) Filed: May 3, 2000

(30) Foreign Application Priority Data

May 12, 1999 (JP) ............................................. P11-131734

(51) Int. Cl.[7] .................. H03F 3/04; H03F 3/68
(52) U.S. Cl. ............... 330/310; 330/284; 330/285; 455/241.1; 455/251.1; 455/253.2
(58) Field of Search ..................... 330/284, 285, 330/310, 311; 455/241.1, 251.1, 253.2

(56) References Cited

U.S. PATENT DOCUMENTS

| 4,520,324 | 5/1985 | Jett, Jr. et al. | 330/285 |
| 6,046,640 | 4/2000 | Brunner | 330/311 |
| 6,163,211 | 12/2000 | Morrish | 3360/311 |

FOREIGN PATENT DOCUMENTS

| 58-202605 | 11/1983 | (JP) | 330/310 |
| 61-210711 | 9/1986 | (JP) | 330/310 |

OTHER PUBLICATIONS

IBM Technical Disclosure Bulletin, "Buffer Amplifier with Ultra–Low Output" Nov. 1986, vol. 29, issue 6 pp. 2436–2438.

Primary Examiner—Michael B Shingleton
(74) Attorney, Agent, or Firm—Jay H. Maioli

(57) ABSTRACT

An amplifier for amplifying a high frequency signal includes comprises cascade-connected an input npn transistor and an output npn transistor and a bias circuit to control a base current Ib of the input transistor in order to make a DC component of a collector current Ic of the cascade-connected npn transistors constant. A shunt transistor is further connected between a base electrode of the input npn transistor and one terminal of a power source and is connected so that the base current of the input npn transistor flows through a resistor connected between a base electrode and an emitter electrode of the shunt transistor. By lowering a base voltage of the output npn transistor in response to a gain control signal, the collector current Ic is reduced, and a gain of the amplifier is reduced, and simultaneously the shunt transistor is made in shunting operation.

8 Claims, 4 Drawing Sheets

HIGH FREQUENCY SIGNAL AMPLIFYING CIRCUIT AND A RECEIVER USING THE SAME

BACKGROUND OF THE INVENTION

1. Field of the Invention

This invention relates to a high frequency signal amplifying circuit, and a receiver for a broadcast, for example the DAB (Digital Audio Broadcasting) system to which the high frequency signal amplifying circuit is applied.

2. Description of the Related Art

Recently, transmission systems for broadcasting have been changed to digital systems from analog systems such as conventional AM (Amplitude Modulation) system or FM (Frequency Modulation) system in accordance with a progress of digitalization.

In Europe, a digital broadcasting for audio signals has already started, and it is commonly called as the DAB (Digital Audio Broadcasting) system. A full constitutional figure of a DAB receiver for the DAB system is depicted in FIG. 3.

Broadcasting waves received by an antenna 1 are supplied to a front-end section which includes a high frequency signal amplifying circuit 2 as shown in FIG.3. In this front-end section, a received signal is supplied to a mixing circuit 3 after amplified by the high frequency signal amplifying circuit 2. This amplified signal from the high frequency signal amplifying circuit 2 is then frequency-converted at this mixing circuit 3 into an intermediate frequency signal by a local oscillation signal supplied from a local oscillation circuit 4.

Thus obtained intermediate frequency signal from the mixing circuit 3 is then amplified at an intermediate frequency signal amplifying circuit 5 by about 60 dB, and then demodulated at a demodulation circuit 6. A demodulated signal from the demodulation circuit 6 is supplied to an A/D (Analog to Digital) converter 7. In this case, a signal level of the demodulated signal from the demodulation circuit 6 is adjusted to be about 1V p—p signal level that is required by the A/D converter 7 as an input level.

A digital signal from the A/D converter 7 is supplied to a base-band processing circuit 8, and after being digitally demodulated at this base-band processing circuit 8, a digitally demodulated signal from the base-band processing circuit 8 is then supplied to a D/A (Digital to Analog) converter 9. At this D/A converter 9, the digitally demodulated signal is converted into an analog audio signal, and finally derived from a speaker 10 as an audio sound.

In the DAB receiver as depicted in FIG.3, as the received signal level is increased, an AGC (Automatic Gain Control) circuit 11 connected to the intermediate frequency signal amplifying circuit 5 starts its operation and controls operation of the high frequency signal amplifying circuit 2. As well known, when the level of the received signal supplied to the high frequency signal amplifying circuit 2 and/or the mixing circuit 3 exceeds a predetermined value, the received signal becomes distorted. In order to avoid this kind of distortion, a gain of the high frequency signal amplifying circuit 2 is controlled to reduce the level of the received signal.

As well known, the OFDM (Orthogonal Frequency Division Multiplex) system is employed to a modulation system of the DAB system. A feature of this OFDM system is to employ a multi-carrier system that carries out demodulation while receiving simultaneously plural carriers. For example, in the technical specification called the DAB mode 2, 384 kinds of carriers are transmitted in a transmission bandwidth of 1.536 MHz with the space of 4 kHz. In order to demodulate these plural carriers, a high frequency signal amplifying circuit is required to have a low distortion characteristics such as the IM3>50dBc, wherein the IM3 means the third inter modulation distortion.

Generally speaking, when two signals (F1 and F1+Fd) apart from each other by Fd in frequency are supplied to an amplifier, there causes distortions in an output of the amplifier at frequencies (F1–Fd and F1+Fd+Fd) apart from each other by Fd due to distortion at the amplifier. These distortion signals are called as the IM (Inter Modulation) signals, and level differences between the level of the input signals (F1) and the distortion signals (F1–Fd) are called as the IM3.

Because a broadcasting service is done at high frequency such as 1.4 GHz band in the DAB system, the DAB receiver is required to have a high frequency signal amplifying circuit having high linearity and being equipped with a gain control circuit upon operating at high frequency.

Namely, the high frequency signal amplifying circuit 2 for the DAB receiver requires to be controlled its gain in accordance with signal strength of the received signal, and requires to operate with low distortion and low noise characteristics.

Presently, the DAB receiver for an auto-mobile use is appeared on the market, and in order to satisfy above-mentioned requirements, the high frequency signal amplifying circuit 2 of the DAB receiver employs a construction including an attenuation circuit such as a PIN diode at the front-end section.

FIG. 4 shows one example of a gain-controllable high frequency signal amplifying circuit used in the conventional DAB receiver. In FIG. 4, an input signal source 12 supplies the received signal in the above-mentioned example in FIG. 3, and the received signal from this input signal source 12 is amplified by an npn transistor 14 after passing through a PIN diode 13. In this case, the input signal source 12 may include a pre-stage circuit instead of the antenna 1. The signal from the npn transistor 14 is then obtained through a load inductor 15 and a load capacitor 16 at an output end 17 as an amplified signal.

A current source 18 is used for supplying a base bias current to the npn transistor 14. Further, a voltage of a DC (Direct Current) voltage source 19 is 3 volts in this example, and resultantly, 5mA of the base bias current is supplied to the a base electrode of the npn transistor 14 from the current source 18.

A current source 20 is an AGC current source in which current value is controlled by a gain control signal from the AGC circuit 11 in FIG. 3. In case of this example, the current source 20 flows current of about 10mA when the level of the received signal is below a predetermined level. In this condition, an On resistance value of the PIN diode 13 is low or almost zero, thereby the received signal from the input signal source 12 is supplied to the npn transistor 14 without attenuation.

As the level of the input signal increases while exceeding the predetermined level, the current value of the current source 20 is reduced by the gain control signal from the AGC circuit 11. Then the resistance value of the PIN diode 13 goes high, and thereby, the received signal supplied from the PIN diode 13 to the npn transistor 14 is attenuated at this PIN diode 13 and the gain of the high frequency signal amplifying circuit in FIG. 4 is lowered. Thus, the high frequency signal amplifying circuit in FIG. 4 is gain-controlled to make the level of the amplified signal to be supplied to the mixing circuit 3 to be a proper value in accordance with the gain control signal from the AGC circuit 11.

But the high frequency signal amplifying circuit in FIG. 4 for the auto mobile DAB receiver is not suitable for a portable radio receiver because of following problems. Namely, 1. The current consumption is 10 mA for the PIN diode and 5 mA for the npn transistor 14, and totally it becomes 15 mA. This amount of the current consumption is too large for a battery-operated portable radio receiver.
2. A semiconductor fabricating process of the PIN diode 13 is different from that of the npn transistor 14, so that it is not suitable for a monolithic fabrication and not suitable for a large-scale integration.

SUMMARY OF THE INVENTION

It is an object of this invention to present a new high frequency signal amplifying circuit.

It is further object of this invention to present a novel high frequency signal amplifying circuit of low power consumption, and low distortion.

It is further another object of this invention to present a new high frequency signal amplifying circuit equipped with a gain control function.

It is still another object of this invention to present a DAB receiver to which a new high frequency signal amplifying circuit is applied.

In order to solve the above-described problems, a high frequency signal amplifying circuit of this invention comprises, an input npn transistor to be supplied a high frequency input signal to its base electrode, an output npn transistor cascade-connected to said input npn transistor for obtaining an amplified signal of said high frequency input signal at a collector electrode of this output npn transistor, a bias circuit for controlling a base current of said input npn transistor by detecting direct current components within currents flowing through the cascade-connected two npn transistors, and a shunt transistor having an emitter electrode connected to the base electrode of said input npn transistor, a collector electrode connected to one terminal of a power source, and a resister connected between the base electrode and the emitter electrode of the shunt transistor in order to flow said base current from said bias circuit.

A gain of the high frequency signal amplifying circuit comprised of the cascade-connected two npn transistors are lowered by reducing a base voltage of the output npn transistor in accordance with a gain control signal, and accordingly collector currents of said input transistor are reduced, and simultaneously the shunt transistor is made in shunt operation.

At the high frequency signal amplifying circuit of the above-described construction, the input signal is amplified by the cascade-connected two transistors. And a DC current of the predetermined value is flowed through this cascade-connected two transistors due to the operation of the bias circuit.

The input npn transistor becomes into saturated condition when a voltage between the collector and the emitter of the input transistor is lowered by the reduction of base voltage of the output npn transistor due to the gain control signal.

And the shunt transistor flows shunt currents due to the increase of the base current owing to the saturation of the output npn transistor, thereby the input signal becomes small to be supplied to the amplifying section comprised of two npn transistors. Accordingly both a control for reducing gain of the amplifying circuit and a control for lowering the input signal by shunting the input section of the amplifying circuit are simultaneously operated.

The DAB receiver of this invention employs a high frequency signal amplifying circuit which comprises, an input npn transistor to be supplied a high frequency input signal to its base electrode, an output npn transistor cascade-connected to the input npn transistor for obtaining an amplified signal of the high frequency input signal at a collector electrode of this output npn transistor, a bias circuit for controlling a base current of the input npn transistor to be a constant value by detecting direct current components within currents flowing through the cascade-connected two npn transistors, and a shunt transistor having an emitter electrode connected to the base electrode of said input npn transistor, a collector electrode connected to one terminal of a power source, and a resister connected between the base electrode and the emitter electrode of the shunt transistor in order to flow said base current from the bias circuit.

As above described, according to the present invention, without using such conventional attenuating circuit, it is possible to realize a high frequency signal amplifying circuit having the gain control circuit with low current consumption by both reducing the gain of the high frequency signal circuit and shunting the input section.

Accordingly, this invention makes it possible to proposes a DAB receiver having characteristics of low power consumption and low noise in a high frequency band.

DESCRIPTION OF THE PREFERRED EMBODIMENTS

Hereinbelow, one embodiment of a high frequency signal amplifying circuit according to the present invention is explained with reference to the drawings. This embodiment shows a high frequency signal amplifying circuit of the present invention as a high frequency signal amplifying circuit of the DAB receiver such as depicted in the aforementioned FIG. 3.

Figure 1:
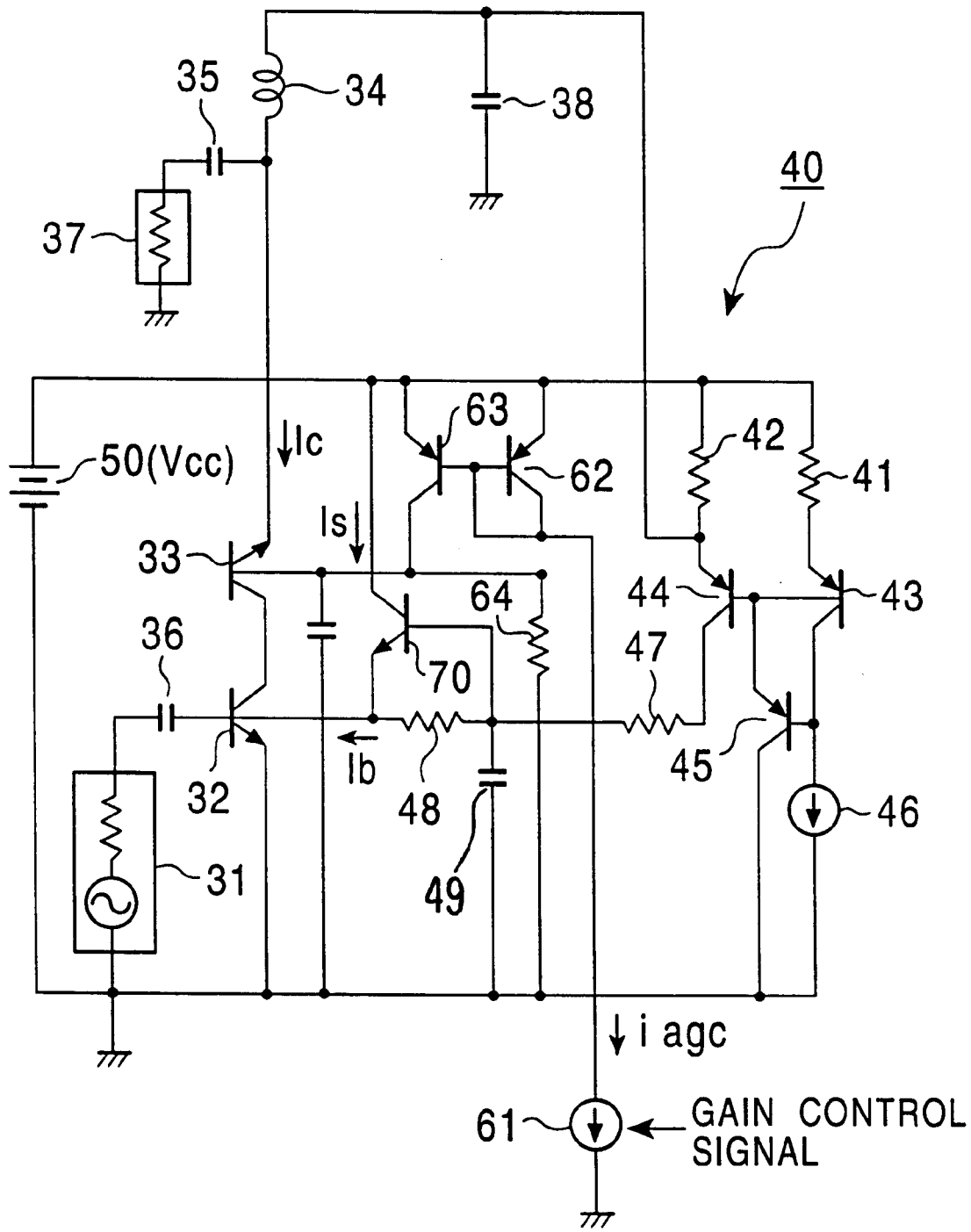
FIG. 1 shows one embodiment of a high frequency signal amplifying circuit according to the present invention.

Namely FIG. 1 shows a high frequency signal amplifying circuit that has a gain control function. An input signal source 31 is a pre-stage circuit and may be the antenna input 1 in case of the example depicted in FIG. 3. The high frequency signal amplifying circuit of this embodiment includes a cascade-connected an input npn transistor 32 and an output npn transistor 33. An emitter electrode of the input npn transistor 32 is grounded, and an inductor 34 and a capacitor 35 are connected to a collector electrode of the output npn transistor 33 as a load.

And an input signal from the input signal source 31 is supplied to a base electrode of the input npn transistor 32 through a coupling capacitor 36. Thus supplied input signal is amplified at the cascade-connected npn transistors 32 and 33, and then derived at an output end 37 through the load including the inductor 34 and the capacitor 35.

A base current of the input npn transistor 32 is controlled so that a collector current Ic of the cascade-connected npn transistors 32 and 33 becomes constant due to a bias circuit 40 during a normal condition. In this normal condition, an AGC (Automatic Gain Control) operation is not active because the signal level of the input signal is below a predetermined level. In case of this embodiment, the amount of the collector current Ic during this normal condition is controlled to be as Ic=5 mA due to the operation of the bias circuit 40.

The bias circuit 40 has a following construction. Namely, one end of a DC (Direct Current) power source 50 which supplies a positive DC voltage Vcc (3V for example) is connected to respective emitter electrode of a pnp transistors 43 and 44 by way of resistors 41 and 42, respectively. Respective base electrode of these pnp transistors 43 and 44 is connected each other, and a junction point thereof is grounded through an emitter electrode and a collector electrode of a pnp transistor 45.

And a collector electrode of the pnp transistor 43 is not only connected to a base electrode of the pnp transistor 45 but also to a ground by way of a current source 46. The current source 46 is a constant current source, and the current value thereof is about 20μA. Further, a collector electrode of the pnp transistor 44 is connected to the base electrode of the input npn transistor 32 by way of resistors 47 and 48. A junction point of the resistors 47 and 48 is grounded by way of a capacitor 49.

Figure 3:
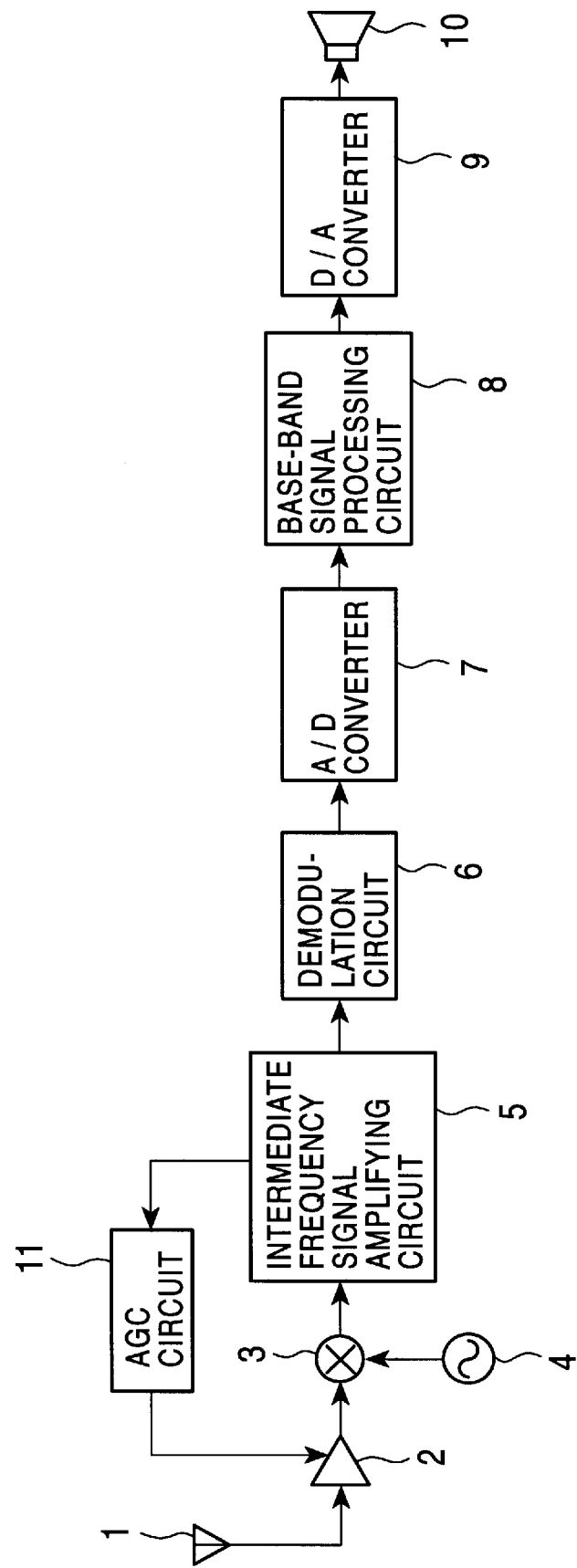
FIG. 3 shows a schematic block diagram of a DAB receiver to which the high frequency signal amplifying circuit of this invention is applied.
Figure 4:
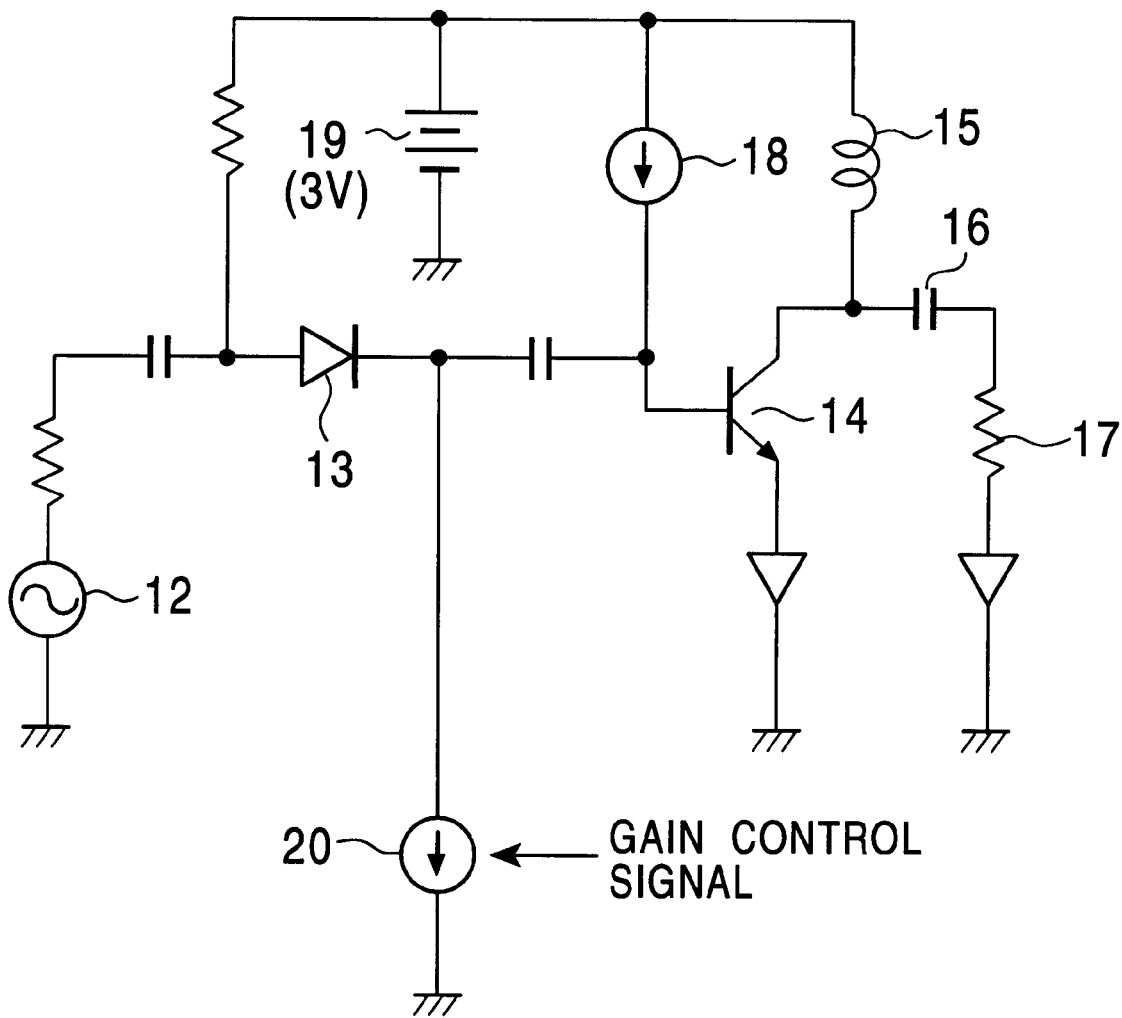
FIG. 4 shows a conventional high frequency signal amplifying circuit.

A base current of the output npn transistor 33 is controlled by an AGC current source 61 which varies a current i agc in accordance with a gain control signal from the AGC circuit 11 in FIG. 3. In case of this embodiment, the current i agc of the AGC current source 61 is supplied to base electrode of the output npn transistor 33 as the base current by way of a pair of pnp transistors 62 and 63 connected as to form a current mirror circuit. A base electrode of the output npn transistor 33 is grounded by way of a resistor 64.

Further a collector-emitter of a shunt transistor 70 is connected between the base electrode of the input npn transistor 32 and the terminal of the DC power source 50. And afore mentioned resistor 48 is connected between a base electrode and an emitter electrode of the shunt transistor 70.

The bias circuit 40 of the high frequency signal amplifying circuit as mentioned in FIG. 1 operates as follows;

The AGC current source 61 supplies, for this embodiment, a current of i agc=80μA, when the AGC (Automatic Gain Control) is not in normal operation. In this normal operation, the level of the input signal is below the predetermined level. In this case, a base voltage of the output npn transistor 33 is high, and the input npn transistor 32 is operating in non-saturating condition, thereby the high frequency signal amplifying circuit comprised of the cascade-connected npn transistors 32 and 33 is operating in the maximum gain.

Figure 2:
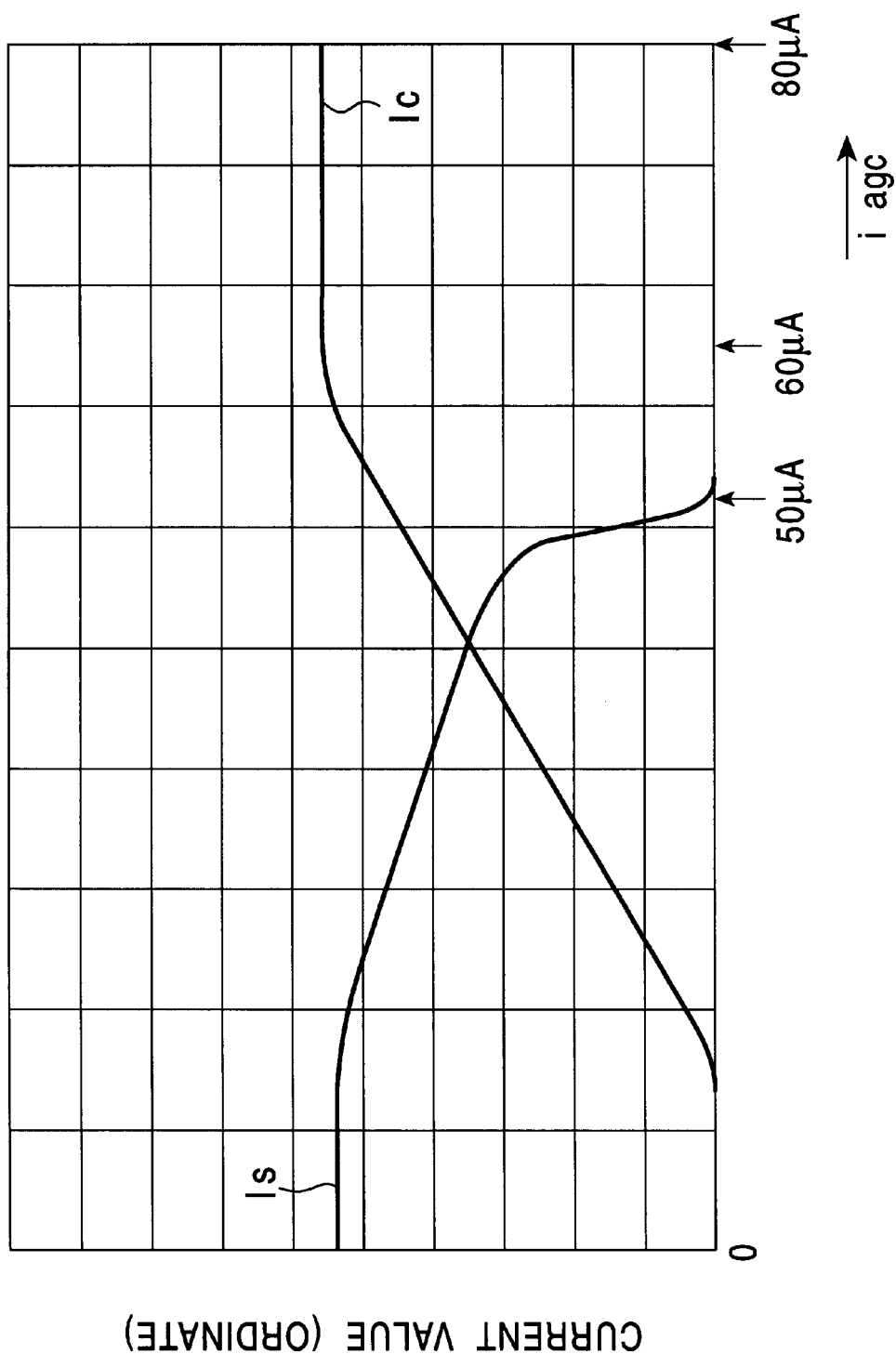
FIG. 2 shows a graph for explaining an operation of the high frequency signal amplifying circuit depicted in FIG. 1.

Once the current i agc is reduced in accordance with the gain control signal from the AGC circuit 11 depicted in FIG. 2, the input npn transistor 32 becomes in saturating condition because the voltage between the collector electrode and the emitter electrode of the input npn transistor 32 is lowered due to the reduction of the base voltage by reducing base current of the output npn transistor 33, and accordingly the gain of the amplifier comprised of the cascade-connected npn transistors 32 and 33 is lowered.

The collector current Ic of the cascade-connected npn transistors 32 and 33 flows through the load inductor 34 to the resistor 42, wherein high frequency components of the collector current Ic are eliminated by the capacitor 38. A current of 20 μA from the current source 46 flows through the transistor 43 and the resistor 41 of 10 K Ω, so that a voltage drop across the resistor 41 is 200 mV. Accordingly a base potential of the transistor 43 becomes Vcc−200 mV−800 mV, because the voltage Vbe between the base electrode and the emitter electrode of the transistor 43 is Vbe=800 mV.

Therefore the collector current Ic and the base current Ib of the input npn transistor 32 are controlled so that a voltage drop across the resistor 42 becomes 200 mV. Namely when the collector current Ic increases, the voltage drop across the resistor 42 increases, and thereby the voltage between the base electrode and the emitter electrode of the pnp transistor 44 is lowered and this causes a negative feedback action as to reduce the base current Ib. Accordingly the collector current Ic is made constant such as 5 mA, even an hfe of the input npn transistor 32 is scattered.

Thus the bias circuit 40 detects the DC component in the collector current Ic of the cascade-connected npn transistors 32 and 33, and controls the base current of the input npn transistor 32 to make this value constant.

Next, the AGC operation of the high frequency signal amplifying circuit of FIG. 1 is explained.

As explained before, it is established that the AGC current i agc=80 a A when the gain is maximum, and the current of 5 mA flows as a collector current Ic due to the operation of the bias circuit 40.

At this time, if the hfe of the input npn transistor 32 is 70, then the base current Ib of this input npn transistor 32 is Ib=70 μA, and the voltage drop across the resistor 48 of 4 k Ω becomes 280 mV. And accordingly the base-emitter voltage of the shunt transistor 70 is small compared with an operating voltage of 700 mV of a transistor. Because of this reason the current Is for shunt flowing through the shunt transistor 70 becomes almost zero.

As before mentioned, the AGC operation starts as the reduction of the AGC current i agc. FIG. 2 shows a relation among the AGC current i agc, the collector current Ic and the shunt current Is. With reference to FIG. 2, the AGC operation is further explained.

As shown in FIG. 2, as the AGC current i agc is reduced from 60 μA, the collector current Ic starts to be reduced, and when the AGC current i agc becomes about 50 μA, the input npn transistor 32 is in saturation, then the gain of the high frequency signal amplifying circuit comprised of the cascade-connected npn transistors 32 and 33 is lowered. At this time, the voltage drop across the resistor 48 becomes large by the increase of the base current Ib of the input npn transistor 32, then the shunt current Is starts to flow, because the base-emitter voltage of the shunt transistor 70 becomes large.

Accordingly, the control of reducing the gain of the high frequency signal amplifying circuit comprised of the cascade-connected npn transistors 32 and 33 and the operation of reducing the input signal by shunting the input section of this amplifier are simultaneously occurs. Further, as a total amount of the collector current Ic and the shunt current Is is approximately 10 mA, so that a consuming current never increases by the AGC operation.

In the [Description of the Related Art] section of the opening paragraph, it is described that the IM3>50 dBc is required as the high frequency signal amplifying circuit of the DAB receiver, but in case of a silicon bipolar transistor it becomes that the IM3<50 dBc when the input exceeds −40 dBm.

For the operation of the AGC, it is possible to reduce the gain by reducing the collector current Ic, but in order to satisfy the distortion characteristics (the IM3) it is necessary to have the shunt operation which reduces the signal at the input section of the amplifier.

According to the circuit configuration for the embodiment as above described, the control for reducing the gain and operation of the reducing the input signal are simultaneously in work as described above, it is possible to satisfy the request such as above described. In case of this embodiment, it was possible to satisfy the AGC operation of 25 dB and the IM3>50 dBc, when the input level to the amplifier comprised of the npn transistors 32 and 33 was within −40 dBm~−15 dBm.

And according to the above described high frequency signal amplifying circuit, in the bias circuit 40 of the input transistor, a feedback circuit which controls the base current Ib by detecting the collector current Ic, so that a collector bias current is made constant in spite of scattering of the hfe of the input npn transistor 32 or a change of a operating temperature.

Further a PIN diode is not required for attenuating the signal, so that the number of parts is reduced and it is possible to attain a miniaturization of the receiver that employs this high frequency signal amplifying circuit. Further it is also possible to attain a low power consumption system compared with the attenuation circuit using the PIN diode.

And there exists a merit that the total consuming current is not increased because the shunt current is increased simultaneously with decreasing the bias current of the amplifier in the AGC operation.

Further the high frequency signal amplifying circuit applied to the DAB receiver as one example in the mode of operation, the high frequency signal amplifying circuit of this invention is applicable not only to a mobile phone terminal which receives a high frequency signals of GHz band, but also to a high frequency signal amplifying circuit, for other high frequency usage, equipped with a gain control circuit.

While I have described and shown the particular embodiments of our invention, it will be understood that many modifications may be made without departing from the spirit thereof, and I contemplate by the appended claims to cover any modifications as fall within the true spirit and scope of my invention.

What is claimed is:

1. A high-frequency signal amplifying circuit comprising:
   an input transistor to which an input signal is supplied;
   an output transistor cascade connected to said input transistor for supplying an output signal to an output;
   a bias circuit coupled to a base electrode of said input transistor for controlling a base current of said input transistor so as to maintain a current flowing through said cascade connected input and output transistors at a predetermined value;
   a shunt transistor coupled between a reference potential and said base electrode of said input transistor; and
   means for coupling a gain control signal to a base electrode of said output transistor.

2. The high-frequency signal amplifying circuit as claimed in claim 1, wherein when said current flowing through said cascade connected input and output transistors is reduced in response to said gain control signal, said shunt transistor starts to perform a shunt operation.

3. The high-frequency signal amplifying circuit as claimed in claim 2, further comprising:
   a resistor coupled between a base electrode and an emitter electrode of said shunt transistor, whereby a bias current from said bias circuit is supplied through said resistor to said base electrode of said input transistor.

4. The high-frequency signal amplifying circuit as claimed in claim 3, wherein a DC component of said current flowing through said cascade connected input and output transistors is supplied to said bias circuit and operations of said input transistor and said shunt transistor are controlled in response to said DC component of the current flowing through said cascade connected input and output transistors.

5. The high-frequency signal amplifying circuit as claimed in claim 4, wherein said current flowing through said cascade connected input and output transistors is reduced by lowering a base voltage of said output transistor in response to said gain control signal.

6. A high-frequency signal receiver comprising:
   a high-frequency signal amplifying circuit supplied with a high-frequency input signal;
   a mixing circuit connected to said high-frequency signal amplifying circuit;
   an intermediate frequency signal amplifying circuit connected to said mixing circuit;
   a local oscillation circuit connected to supply a local oscillation signal to said mixing circuit; and
   an AGC circuit coupled between said intermediate frequency signal amplifying circuit and said high-frequency signal amplifying circuit, wherein said high-frequency signal amplifying circuit includes an input transistor to which said high-frequency input signal is supplied;
   an output transistor cascade connected to said input transistor for supplying an output signal to said mixing circuit,
   a bias circuit coupled to a base electrode of said input transistor for controlling a base current of said input transistor, so as to maintain a current flowing through said cascade connected input and output transistors at a predetermined value; and
   a shunt transistor coupled between a reference potential and said base electrode of the input transistor; and
   means for coupling a gain control signal to a base electrode of said output transistor.

7. The high-frequency signal receiver as claimed in claim 6, wherein said high-frequency signal amplifying circuit further includes a resistor coupled between a base electrode and an emitter electrode of said shunt transistor, whereby a bias current from said bias circuit is supplied through said resistor to said base electrode of the input transistor.

8. The high-frequency signal receiver as claimed in claim 7, wherein a DC component of said current flowing through said cascade connected input and output transistors is supplied to said bias circuit and operations of said input transistor and said shunt transistor are controlled in response to said DC component of the current flowing through said cascade connected input and output transistors.

* * * * *